United States Patent
Kinanen

(10) Patent No.: US 6,433,550 B1
(45) Date of Patent: Aug. 13, 2002

(54) MRI MAGNET WITH VIBRATION COMPENSATION

(75) Inventor: Ilmari Kinanen, Espoo (FI)

(73) Assignee: Koninklijke Philips Corporation N.V., Eindhoven (NL)

( * ) Notice: Subject to any disclaimer, the term of this patent is extended or adjusted under 35 U.S.C. 154(b) by 0 days.

(21) Appl. No.: 09/782,250

(22) Filed: Feb. 13, 2001

(51) Int. Cl.[7] .................................................. G01V 3/00
(52) U.S. Cl. ........................................ 324/320; 324/318
(58) Field of Search .................................. 324/320, 319, 324/318, 317, 309, 300; 335/216, 296

(56) References Cited

U.S. PATENT DOCUMENTS

| | | | | |
|---|---|---|---|---|
| 5,548,653 A | * | 8/1996 | Pla et al. .................. | 381/71.11 |
| 5,731,704 A | * | 3/1998 | Schnur et al. ............... | 324/319 |
| 6,092,928 A |   | 7/2000 | Mattson et al. ............. | 378/205 |
| 6,169,404 B1 | * | 1/2001 | Eckels ........................ | 324/318 |

* cited by examiner

Primary Examiner—Louis Arana
(74) Attorney, Agent, or Firm—Fay, Sharpe, Fagan, Minnich & McKee, LLP

(57) ABSTRACT

In an open magnetic resonance system, pole pieces (16, 18) on opposite sides of an imaging region (10) are supported by a ferrous flux return path (20). During normal operation, environmental disturbances that cause low frequency vertical vibrations in the floor cause corresponding fluctuations in the main field of the magnet. A spacing between the pole pieces (16, 18) expands and contracts with the vibration causing a strength of the main field to fluctuate. A force transducer (60) under the magnet assembly measures the magnitude of the vibrations. A vibration analyzer (62) analyzes the vibrations waveform and calculates compensation for the changes in the interpole spacing. The vibration analyzer (62) controls one or more of a shim coil (70) which produces a field equal and opposite to the main field fluctuations, a reconstruction processor (52) to compensate for magnetic field resonance frequency fluctuations attributable to the main field fluctuations, and gradient magnetic fields applied by gradient field coils (22, 24).

18 Claims, 1 Drawing Sheet

MRI MAGNET WITH VIBRATION COMPENSATION

BACKGROUND OF THE INVENTION

The present invention relates to the diagnostic imaging arts. It finds particular application in conjunction with open MRI systems with a C-shaped flux return path and will be described with particular reference thereto. It will be appreciated, however, that the present invention is useful in conjunction with other open systems, such as systems with H-shaped flux return paths, four poster arrangements, no ferrous flux return path, and the like, and is not limited to the aforementioned application.

In magnetic resonance imaging, a uniform main magnetic field typically denoted $B_0$ is created through an examination region in which a subject to be examined is disposed. The resonance frequency in the field is determined by the field strength and the gyromagnetic ratio of dipoles to be resonated. With open magnetic resonance systems, the main magnetic field is typically vertical, perpendicular to the subject between upper and lower poles. A series of radio frequency (RF) pulses at frequencies coordinated to the resonance frequency are applied to two RF coils, one adjacent each pole, to excite and manipulate magnetic resonance. Gradient magnetic fields are conventionally produced by gradient coils to alter the resonance frequency in a preselected relationship with spatial position. The gradient coils are typically mounted between the RF coils and the poles. The magnetic resonance signals are detected with the two RF coils or localized coils and processed to generate two or three dimensional image representations of a portion of the subject in the examination region.

After pulses are applied by the RF coils, the excited dipoles decay back to the state of lowest energy. This is done at a characteristic frequency called the Larmor frequency. The Larmor frequency is a function of the total field strength, i.e., the sum of the main magnetic field and the superimposed gradient field. Thus, when the field strength varies, so does the Larmor frequency. When the field strength varies only with the applied gradients, the accurate calibration of field strength to spatial position within the examination region results in accurate images. However, when the field strength varies due to other, uncalibrated causes, ghosting and other artifacts in the final images result. When the main $B_0$ field strength oscillates, the position of anatomical structures oscillate in the resultant image causing ghosting and other artifacts.

In open magnet systems, the poles are a set distance apart. This distance, along with the current strength in the superconducting magnet and other factors determine the strength of the main magnetic field in the examination region. If this distance changes, the $B_0$ field strength changes causing problems with imaging as discussed previously.

In an open system having a 0.5 m opening, and a 0.23 T main field strength, a change of 1 ppm (part per million) in the aperture causes a 1 ppm change in the field strength, subsequently changing the Larmor frequency. Thus, a 0.5 μm variation in the aperture varies the Larmor frequency by approximately 10 Hz. This is enough of a variance to cause ghosting in the final images. In higher field magnets, the frequency shift is significantly worse.

The aperture of an open system may change from any number of reasons. In a typical C-magnet system as described previously, an acceleration of only one thousandth of earth gravity (1 mg) produces a 1 ppm change in the aperture. Reasons such as people walking in the examination room or adjacent rooms, slamming doors, trucks in the street, and seismic activity can cause variations of this order of magnitude and higher. The acoustic reverberations of gradient and RF activity also cause vibration in the distance between the poles.

Previously, dampeners, such as rubber pads under the pole and flux return path, have been used to dampen environmental vibration forces. Such dampeners were effective for eliminating higher frequency components of vibrations, but lower frequency vibrations in the range of 5–20 Hz were less attenuated. A further disadvantage of using soft material to isolate vibrations is that the magnet is not supported in a firm position and it may shift from the original intended position.

Another method used is active vibration cancellation. These systems are massive and expensive. Typically large mechanical drivers are mounted under the pole and flux return path assembly. Environmental vibration is sensed and converted into counteracting physical movement. I this way, the actuators strive to create equal and opposite canceling vibrations. In spite of the expense, the ability of these systems to cancel vibrational movement is limited.

The present invention provides a new and improved method and apparatus that overcomes the above referenced problems and others.

SUMMARY OF THE INVENTION

In accordance with one aspect of the present invention, a magnetic resonance apparatus is given an imaging region is defined between upper and lower poles through which a main magnetic field is generated. A gradient coil assembly superimposes magnetic field gradients on the main magnetic field. A radio frequency coil assembly excites magnetic resonance in selected dipoles of a subject disposed in the imaging region. A reconstruction processor reconstructs received magnetic resonance signals into image representations. A force transducer is placed under the lower pole assembly to measure vibrations in the magnetic resonance apparatus.

According to a more limited aspect of the present invention, a vibration analyzer amplifies and processes signals to affect an operating frequency of a main oscillator to counteract the vibrations.

According to another aspect of the present invention, a method of magnetic resonance imaging is provided. A main magnetic field is induced through an examination region between a pair of pole assemblies. A subject is in the examination region. Magnetic resonance is excited, spatially encoded and received from selected dipoles within the subject. The signals are processed into a human readable form. Vibrations that alter the distance between pole assemblies are measured.

According to another aspect of the present invention, a magnetic resonance apparatus is provided. A substantially constant magnetic field is generated by a magnet between two pole assemblies, the field fluctuating due to an inconsistent distance between pole assemblies. A radio frequency transmitter induces resonance in selected dipoles that resonate at a resonance frequency, the frequency fluctuating as the main field fluctuates. A radio frequency receiver receives and demodulates the emitted resonance signals. A vibration sensor is connected with at least one of the pole assemblies. A vibration analyzing processor analyzes the sensed vibrations and determines compensations.

One advantage of the present invention is that it reduces imaging artifacts.

Another advantage of the present invention is that it provides images with sharp contrast.

Another advantage of the present invention is that it provides a more uniform and stable main magnetic field.

Another advantage is that it offers improved stability to an MR system.

Still further benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENT

Figure 1:
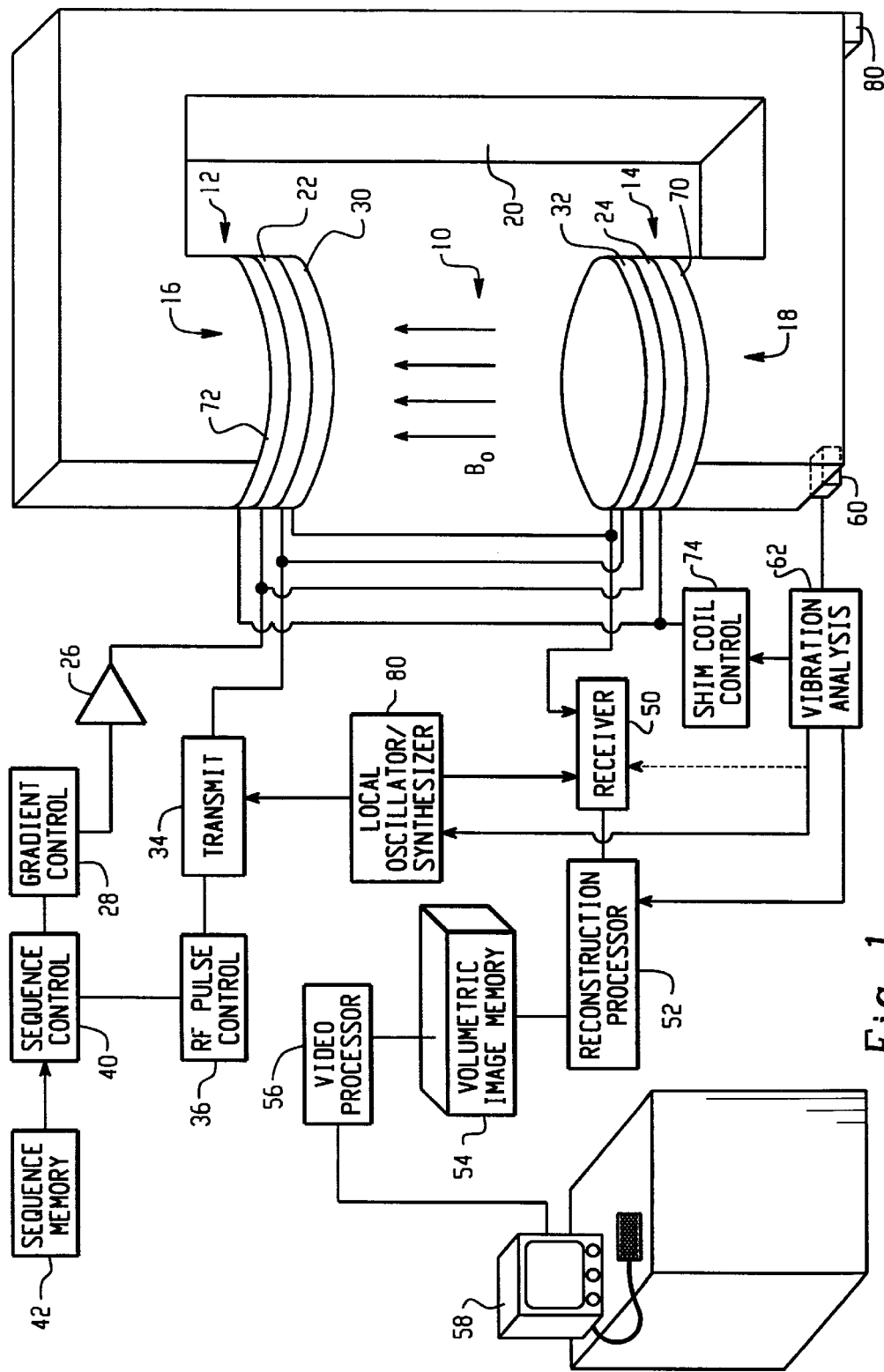
FIG. 1 is a diagrammatic illustration of a magnetic resonance imaging system in accordance with the present invention.

With reference to FIG. 1, in an open MRI system, an imaging region 10 is defined between an upper pole assembly 12 and a lower pole assembly 14. A pair of magnetic flux sources are disposed adjacent to upper and lower pole pieces 16, 18 generating a temporally constant, main magnetic field $B_0$ through the imaging region 10. It is to be appreciated that the open MRI apparatus may have a variety of pole pieces or, in some instances, no pole pieces at all. The magnets for generating the main magnetic field can be positioned at other locations. A ferrous flux return path 20 is provided between the pole assemblies remote from the imaging region 10. The flux return path in the preferred embodiment is a C-shaped path that supports the upper pole assembly. Alternately, the flux return path 20 could be an H-shaped arrangement, a four-poster arrangement, imbedded in the walls, or the like. The use of a pair of pole pieces with no defined flux path, just the ambient surroundings through which flux returns, is also contemplated.

For imaging, magnetic field gradient coils 22, 24 are disposed on opposite sides of the imaging region 10 adjacent the pole pieces 16, 18. In the preferred embodiment, the gradient coils are planar coil constructions which are connected by gradient amplifiers 26 to a gradient magnetic field controller 28. The gradient magnetic field controller 28 causes current pulses which are applied to the gradient coils 22, 24 such that gradient magnetic fields are superimposed on the temporally constant and uniform field $B_0$ across the imaging region 10. The gradients of the fields aligned with the main field are typically oriented along a longitudinal or y-axis, a vertical or z-axis and a transverse or x-axis.

For exciting magnetic resonance in selected nuclei, an upper radio frequency coil 30 and a lower radio frequency coil 32 are disposed between the gradient coils 22, 24 adjacent the imaging region 10. The coils 30,32 generate narrow spectrum RF magnetic fields in a band around a selected resonance frequency, typically denoted $B_1$, within the imaging region. The coils 30, 32 are connected to one or more RF transmitters 34 that transmits pulses designated by an RF pulse controller 36. RF screens are disposed between the RF coils 30, 32 and the gradient coils 22, 24 to minimize the generation of RF eddy currents in the gradient coils 24, 26. The RF coils 30, 32 transmit $B_1$, magnetic field pulses into the imaging region.

A sequence controller 40 accesses a sequence memory 42 to withdraw one or more RF and gradient pulse imaging sequences, which are implemented by the gradient controller 28, and the RF pulse controller 36 in a coordinated relationship. Typically, the sequence controller 40 causes the pulse controller and the RF transmitter to transmit pulses into the imaging region commensurate with the application. That is, different sequences are designed to illustrate different features of the subject.

In applications in which the radio frequency coils 30, 32 operate in both transmit and receive modes, magnetic resonance signals are picked up by the radio frequency coils 30, 32. The resonance signals are demodulated by one or more receivers 50, preferably digital receivers. The digitized signals are processed by a reconstruction processor 52 into volumetric or other image representations which are stored in a volumetric image memory 54. A video processor 56, under operator control, withdraws selected image data from the volume memory and formats it into appropriate data for display on a human readable display 58, such as a video monitor, active matrix monitor, liquid crystal display, or the like.

In order to sense environmental disturbances that result in the vibration of the floor or any other support structure of the magnet assembly, a force transducer 60 is disposed underneath the lower pole assembly 14 between the lower pole assembly and the floor in the preferred embodiment. Preferred sensors have accurate, readily anticipated responses to frequencies in the 2–70 Hz range. The force transducer is preferably a strain gauge type transducer, and has approximately the same compressibility of hard rubber shoes previously used to dampen vibrations, which compressibility dampens vibrations in the 20–70 Hz range. Alternately, piezoelectric discs can be used. The force transducer produces an output voltage waveform at least in the 5–20 Hz frequency range indicative of any vertical compressions experienced by the pole assemblies. The output waveform is processed by a vibration analyzer 62 which determines the corresponding changes in the distance between the upper pole assembly 12 and the lower pole assembly 14 due to the vibration, the attractions in the main $B_0$ field due to the changes, and ultimately the corrections to compensate. Preferably, the signal may be processed by a digital signal processor to have a high degree of control intelligence before being fed to the vibration analyzer 62. In the preferred embodiment, higher frequency vibrations are dampened by the transducer and do not affect the stability of the system. Frequencies below 2 Hz are filtered by high pass filters because their effect on the magnet is not significant. The effect of the voltage waveform components in the range of 5–20 Hz on the $B_0$ field is measured during initial calibration and appropriate corrections are calculated.

In one preferred embodiment, the analysis of the vibration waveform is used to correct the $B_0$ field strength. As the MR assembly is vibrated up and down, the massive upper pole assembly 12 has such inertia that the interpole spacing between pole pieces 16, 18 expands and contracts. This variance causes the strength of the main field to vary. As the pole pieces come closer together, the field strengthens. Conversely, as they move apart, the field weakens. Given the vibration waveform from the transducer 60, a variance of the distance with time is found by measurement during design and set up. Mathematically it is relatively simple to take an instantaneous $\Delta d$ of the gap between pole pieces and convert it into a $\Delta B_0$. Look up tables are also contemplated. At least one and preferably a pair of shim coils 70, 72 controlled by a shim coil control 74 produces a magnetic field to counteract the calculated change in the magnetic field due to vibrations. For example, an activity waveform of the shim coil is inverted and scaled in comparison to the vibration waveform. The resultant effect of both the vibrations and shim coil counteract, resulting in a temporally constant main field.

In a second preferred embodiment, the vibration waveform is used to adjust the spatial encoding gradient pulses. The resonant frequency is a function of the field strength. In one common mode, the RF pulse has a frequency which excites a whole slice or slab at the location where the sum of a slice select gradient and the $B_0$ field has a preselected strength. Subsequent gradient fields vary the main field to shift the frequencies of the resonating dipoles to preselected frequencies at each spatial increment. However, when vibrations vary the main $B_0$ field, the spatial location at which expected resonant frequencies occur are shifted. The receiver 50 correlates frequency of received signals with spatial position in the read gradient dimension. Thus, if dipoles are resonating at a shifted frequency under the read gradient, the reconstruction processor 52 assigns a shifted spatial position in that read direction. Thus, if the $B_0$ field oscillates or varies with time, a ghosted, blurred image results.

In this second embodiment, the vibration analyzer 62 uses the vibration waveform to variably shift at least the frequency sensitivity of the receiver, as ghosted in FIG. 1 to hold the total magnetic field constant at each spatial location along the read direction constant. Preferably, a local oscillator/synthesizer 80 generates an RF pulse modulated by the vibration waveform such that the receiver signal is substantially unaffected by the vibrations. This eliminates read direction ghosting.

In a third preferred embodiment, the sensed vibrations or oscillations are correlated to oscillating shifts in the resonance frequency and phase. The reconstruction processor 52 is programmed to alter the phase encoding of the signal corresponding to the vibration induced force changes. Optionally, a correction is made to spatial location as well as corresponding to frequency effects in the read direction. The transmitter and receiver may be adjusted, as necessary to transmit and demodulate in a frequency spectrum corresponding to the shifting resonance frequencies across the examination region.

In an alternate embodiment, multiple force transducers are disposed underneath the MR assembly. Their contributions are mathematically weighted according to their position. This embodiment is useful for non-uniform variations in the main magnetic field. If the distance between the sides of the pole pieces move less than the other sides, non-uniform changes in the $B_0$ field can be sensed and corrected. Optionally, a hinge 80 supports the back of the magnet assembly, while the front of the magnet assembly under the pole is supported by the force transducer 60.

In another alternate embodiment, one or more force transducers adjacent to a firm support or accelerometers are placed on the vertical portion of the flux return path to measure horizontal displacement. The vibration analyzing processor 68 generates analogous corrections to those discussed above for horizontal vibration induced $B_0$ field variations.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance apparatus comprising:
   an upper pole assembly and a lower pole assembly defining an imaging region therebetween through which a main magnetic field is generated;
   a gradient coil assembly for superimposing encoded magnetic field gradients upon the main magnetic field;
   a radio frequency coil assembly for exciting magnetic resonance in selected dipoles of a subject disposed in the imaging region;
   a reconstruction processor for reconstructing received magnetic resonance into an image representation of the subject in the imaging region;
   at least one force transducer disposed between the lower pole assembly and a support structure for measuring vibrations of the magnetic resonance apparatus.

2. The magnetic resonance apparatus as set forth in claim 1, further including:
   a flux return path; and,
   a second transducer connected with the flux return path for measuring horizontal vibration components.

3. The magnetic resonance apparatus as set forth in claim 1, wherein the at least one force transducer includes a strain gauge type force transducer.

4. The magnetic resonance apparatus as set forth in claim 1, further including:
   a hinge disposed under a portion of a flux return path.

5. The magnetic resonance apparatus as set forth in claim 1, further including:
   a means for damping vibrations above 70 Hz.

6. A magnetic resonance apparatus comprising:
   an upper pole assembly and a lower pole assembly defining an imaging region therebetween through which a means generates a main magnetic field;
   a means for superimposing encoded magnetic field gradients upon the main magnetic field;
   a means for exciting magnetic resonance in selected dipoles of a subject disposed in the imaging region;
   a means for reconstructing received magnetic resonance into an image representation of the subject in the imaging region;
   a means for measuring vibrations of the magnetic resonance apparatus;
   a vibration analyzer which analyzes signals from the vibration measuring means;
   a magnetic field shim coil operated under control of the vibration analyzer to generate a magnetic field that counteracts magnetic field variations caused by the vibrations.

7. A magnetic resonance apparatus comprising:
   an upper pole assembly and a lower pole assembly defining an imaging region therebetween through which a main magnetic field is generated;
   a means for superimposing encoded magnetic field gradients upon the main magnetic field;
   a means for exciting magnetic resonance in selected dipoles of a subject disposed in the imaging region;
   a means for reconstructing received magnetic resonance into an image representation of the subject in the imaging region;
   a means for measuring vibrations of the magnetic resonance apparatus; and, a vibration analyzer which amplifies and processes signals from the vibration measuring means and generates correction signals to change an operating frequency of a main oscillator controlling at least a receiver frequency to counteract errors attributable to variations in the main magnetic field caused by the measured vibrations.

8. A magnetic resonance apparatus comprising:

a means for superimposing encoded magnetic field gradients upon the main magnetic field;

a means for exciting magnetic resonance in selected dipoles of a subject disposed in the imaging region;

a means for reconstructing received magnetic resonance into an image representation of the subject in the imaging region;

at least one force transducer disposed between the lower pole assembly and a support structure for measuring vibrations of the magnetic resonance apparatus; and, a vibration analyzing means for analyzing signals from the vibration measuring means and modifying a phase encoding accordingly to cancel effects of vibration induced field modulation in phase encoding.

9. A method of magnetic resonance imaging comprising:

inducing a main magnetic field through an examination region between a pair of spaced pole assemblies, a subject being received in the examination region;

exciting magnetic resonance in selected dipoles of the subject;

spatially encoding the main magnetic field with gradient fields;

measuring vibrations in a 2–70 Hz range that alter a spacing between the pole assemblies with a strain gauge force transducer;

receiving and demodulating magnetic resonance signals from the resonating dipoles;

processing the received resonance signals into a human readable form.

10. The method as set forth in claim 9, further including:

producing a vibration model corresponding to the measured vibrations; and, adjusting a frequency of a main oscillator based on the vibration model.

11. The method as set forth in claim 10, further including:

compensating for the vibrations based on the vibration model by adjusting a strength of the main magnetic field.

12. The method as set forth in claim 11, wherein the step of compensating for the vibrations includes:

inducing a shim coil to produce fields approximately equal and opposite to field fluctuations attributable to the alterations in the spacing between the pole assemblies caused by the vibrations.

13. The method as set forth in claim 9, further including:

dampening a portion of the vibrations with the strain gauge force transducer.

14. The method as set forth in claim 9, further including:

measuring horizontal vibrations and dampening a portion of the horizontal vibrations with a strain gauge type force transducer.

15. The method as set forth in claim 9, wherein the vibration measuring step includes:

measuring vibrations with vibrational frequencies greater than 2 Hz and less than 70 Hz.

16. The method as set forth in claim 15, further including:

dampening vibrations with vibrational frequencies above 70 Hz.

17. A method of magnetic resonance imaging comprising:

inducing a main magnetic field through an examination region between a pair of spaced pole assemblies, a subject being received in the examination region;

exciting magnetic resonance in selected dipoles of the subject;

spatially encoding the main magnetic field with gradient fields;

measuring vibrations that alter a spacing between the pole assemblies;

adjusting one of:
  a frequency encode gradient to compensate for the measured vibrations;
  a frequency of a main oscillator based on the measured vibrations;
  main magnetic field based on the measured vibrations;
  a phase encode gradient to compensate for the measured vibrations;

receiving and demodulating magnetic resonance signals from the resonating dipoles; and, processing the received resonance signals into a human readable form.

18. A magnetic resonance apparatus comprising:

a pair of pole assemblies;

a magnet which establishes a substantially temporally constant main magnetic field between the pole assemblies which main magnetic field undergoes strength fluctuations in response to fluctuations in a distance between the pole assemblies;

a gradient field system which superimposes gradient magnetic fields on the main magnetic field;

a radio frequency transmitter which induces selected dipoles in the main magnetic field to resonate emitting resonance signals with a resonance frequency related to the magnetic field strength, which resonance frequency fluctuates with fluctuations in the main magnetic field strength;

a radio frequency receiver which receives and demodulates the emitted resonance signals;

a reconstruction processor connected with the radio frequency receiver for reconstructing the demodulated signals therefrom into image representations;

a vibration sensor connected with at least one of the pair of pole assemblies;

a vibration analyzing processor which analyzes vibrations sensed by the vibration sensor and based on the analyzed vibrations compensates for the fluctuations in the distance between the pole pieces by at least one of:
  controlling shim coils to generate fluctuating shim magnetic fields between the pole assemblies which cancel the main magnetic field fluctuations;
  adjusting the gradient field system; and,
  adjusting the reconstruction processor.

* * * * *

UNITED STATES PATENT AND TRADEMARK OFFICE
CERTIFICATE OF CORRECTION

PATENT NO. : 6,433,550 B1
DATED : August 13, 2002
INVENTOR(S) : Ilmari Kinanen

It is certified that error appears in the above-identified patent and that said Letters Patent is hereby corrected as shown below:

<u>Title page,</u>
Item [75], Inventors, please add: -- Panu O. Perko (of Espoo Finland) --.

Signed and Sealed this

Thirtieth Day of March, 2004

JON W. DUDAS
*Acting Director of the United States Patent and Trademark Office*